US006676856B1

(12) United States Patent
Smith

(10) Patent No.: US 6,676,856 B1
(45) Date of Patent: Jan. 13, 2004

(54) DEACIDIFICATION TREATMENT OF PRINTED CELLULOSIC MATERIALS

(76) Inventor: Richard Daniel Smith, 224 Early St., Park Forest, IL (US) 60466

( * ) Notice: Subject to any disclaimer, the term of this patent is extended or adjusted under 35 U.S.C. 154(b) by 0 days.

(21) Appl. No.: 09/582,848

(22) Filed: Jul. 5, 2000

Related U.S. Application Data

(60) Provisional application No. 60/071,103, filed on Jan. 9, 1998.

(51) Int. Cl.[7] .......................... C09K 3/00; C09K 15/32; C23C 16/00; C23F 11/04; B05D 3/00

(52) U.S. Cl. .................... 252/387; 252/400.62; 422/10; 422/12; 427/248; 427/296

(58) Field of Search ............................ 252/387, 400.62; 422/10, 12; 427/248, 296

(56) References Cited

U.S. PATENT DOCUMENTS

| | | | | |
|---|---|---|---|---|
| 3,676,055 A | | 7/1972 | Smith | 8/120 |
| 3,676,182 A | | 7/1972 | Smith | 117/60 |
| 3,969,549 A | | 7/1976 | Williams et al. | 427/248 |
| 4,182,801 A | | 1/1980 | Miserlis et al. | 526/77 |
| 4,318,963 A | | 3/1982 | Smith | 428/537 |
| 4,401,810 A | | 8/1983 | Tang et al. | 536/56 |
| 4,860,685 A | | 8/1989 | Smith | 118/300 |
| 5,094,888 A | | 3/1992 | Kamienski et al. | 427/296 |
| 5,104,997 A | * | 4/1992 | Kamienski et al. | 162/160 |
| 5,208,072 A | * | 5/1993 | Kamienski et al. | 427/296 |
| 5,264,243 A | | 11/1993 | Wedinger et al. | 427/140 |
| 5,409,736 A | | 4/1995 | Leiner et al. | 427/372.2 |
| 5,422,147 A | | 6/1995 | Leiner et al. | 427/600 |
| 5,770,148 A | | 6/1998 | Leiner et al. | 422/40 |

OTHER PUBLICATIONS

Geoffrey Morrow, *Mass Deacidification: Operational Experience at The National Archives and The National Library of Canada*, Proceedings of the Institute of Paper Conservation 10th Anniversary Conference, "New Directions in Paper Conservation," Oxford University, pp. 1–8 (Apr. 14–18, 1986).

Richard Daniel Smith, *Design of a Liquified Gas Mass Deacidification System for Paper and Books*, reprinted from Advances in Chemistry Series, No. 164, Preservation of Paper and Textiles of Historic and Artistic Value, pp. 149–158 (1977).

* cited by examiner

*Primary Examiner*—Margaret Medley
(74) *Attorney, Agent, or Firm*—Fitch, Even, Tabin & Flannery

(57) ABSTRACT

The invention provides for improvements in composition and methods for the preservation of cellulosic materials through use of solutions comprising organic multi-valent metal carbonates, $C_1$–$C_4$ alcohol having a moisture content of less than 100 ppm, and 86–99 weight percent of a solvent having a moisture content of less than 100 ppm.

11 Claims, 3 Drawing Sheets

DEACIDIFICATION TREATMENT OF PRINTED CELLULOSIC MATERIALS

RELATED APPLICATION

This application is a 371 of PCT/US99/00434 filed Jan. 8, 1999 which is based on, and claims the benefit of, U.S. Provisional Application Serial No. 60/071,103, filed Jan. 9, 1998.

FIELD OF THE INVENTION

The present invention relates generally to compositions and methods for deacidification treatment and preservation of printed cellulosic materials, such as books, manuscripts and other image and information bearing documents and publications and works of art on paper, which may deteriorate or which may have become deteriorated through aging.

BACKGROUND OF THE INVENTION

During the past 150 years, archives and libraries have struggled to prevent the aging of paper, i.e., yellowing and embrittlement of paper in documents and books. Many treatments to avoid or stop this aging have been proposed. The primary goals of these treatments are to either transform the paper into another, more stable medium or stabilize the paper against aging by deacidification. Deacidification has advantages in its effectiveness for many more years, availability of stabilized materials for use, and lower unit treatment costs.

Although previously known treatments reduce the rate that books and documents are aging, all known methods have the potential to deface or otherwise so harm significant portions of the collection so that the items are rendered unsatisfactory for ordinary use. Furthermore, numerous problems and environmental concerns exist with current treatment methods.

Moisture variation in anhydrous raw materials presents a significant problem when using most known treatment methods. As the quantity of moisture increases, either powder or gel precipitates will be formed, depending on time, reactivity, temperature and pressure conditions. These precipitates may prevent (poison), impede (slow) a manufacture or reaction rate and detrimentally affect the deacidification workability of solutions (clog paper substrates). The precipitates also may deposit on and deface books and documents and block or clog filters, pipes, valves and other restricted passages in processing equipment. They may also deposit thick coatings on walls of tanks and, depending on relative densities, separate into top or bottom phase composition layers or even, in extreme cases. actually turn the treating solution (initially thinner than water) into an immobile gelatin-like gel.

Although produced, ultra-low moisture alcohol and aliphatic hydrocarbon solvents are not available commercially in standard containers, e.g., in 5-gallon pails or 55-gallon drums. Industrial solvent manufacturers do not deliver their solvents in an ultra-dry condition, i.e., below 15 or 25 ppm. For example, the maximum moisture content specification for a 55-gallon drum of research grade “anhydrous” methanol from Fisher Scientific is 1,000 ppm.

Sub-micron (less than 0.2 microns) coal black particles are known to precipitate in concentrates prepared for current treatment methods. The particles may be introduced as trace heavy metal (iron, cobalt, copper, etc.) impurities in the metals reacted with alcohols to produce alkoxide powders for use in treatment or by external conditions. These particles contaminate and discolor the treatment concentrate and must be removed before use in preservation. Additionally, allowing the particles to agglomerate naturally then filtering through a 0.2 micron absolute membrane filter limits the concentration of treatment concentrates that can be manufactured. For example, concentrations of organic magnesium of up to only 25 percent by weight in methanol are a maximum.

The more alkaline pH values produced by organic magnesium carbonate treatments may cause undesirable color changes. These treatments may cause sensitive inks, pigments, and dyes to change color when the cellulosic material is changed from a deteriorating acidic condition to a stable alkaline condition.

The traditional CFC and HCFC solvent systems for organic metal carbonate deacidification compositions tend to deface or damage some types of inks and or cause structural book components to dissolve or soften. The more sensitive inks soften, bleed, strike through, offset, and in some cases, even glue the leaves of pamphlets and books together into solid blocks. In addition, the use of chlorofluorocarbon solvents is generally prohibited by environmental regulations.

Despite extensive efforts and the many solutions proposed for stopping aging, a truly satisfactory method that extends the useful life of cellulosic materials for hundreds of years has not been developed. No effective treatment is known that is acceptable for essentially all paper, inks, pigments, media, or other components of printed materials and is not hazardous to users.

Accordingly, it is a principal object of this invention to provide improved deacidification compositions and methods for making them, for preserving printed and written cellulosic materials, such as books, drawings, maps, works of art, manuscripts and images.

It is an additional object of this invention to provide a method for universally preserving these cellulosic materials bearing printing, writing, drawings, or other recordings, with little or no impairment of inks, images, bindings or other visual or structural features.

These and other objects of the invention will become apparent from the following specification and accompanying drawings.

SUMMARY OF THE INVENTION

Generally, in accordance with the present invention, a deacidification composition for treating printed cellulosic materials is provided. A method of making the composition and a method of preparing components of the composition also are provided. In an important aspect, the composition comprises a metal carbonate, an ultra-dry alcohol having a moisture content of less than about 100 ppm and an ultra-dry solvent having a moisture content of less than about 100 ppm, the solvent selected from the group consisting of alcohols, aliphatic hydrocarbons, fluorocarbons and blends thereof, in amounts effective for treating and preserving printed cellulosic materials.

The deacidification treatment compositions of the present invention are made by first treating alcohol, fluorocarbon, aromatic hydrocarbon or aliphatic hydrocarbon solvents with a molecular sieve or other desiccant to reduce the moisture content below 100 ppm, to produce ultralow moisture solvents. An organic metal alkoxide is blended with the ultralow moisture alcohol solvent and carbon dioxide to form an organic metal carbonate composition. Submicron-sized magnetic impurities from the organic metal carbonate composition are removed using magnetic filtration. Then the organic metal carbonate composition is filtered through a submicron filter to produce a deacidification treatment concentrate. Finally, the deacidification treatment concentrate is blended with the ultralow moisture solvent to provide a deacidification treatment solution having relatively inert solvation characteristics toward inks and structural components of printed cellulosic materials. This composition can be used in any known method of treating printed cellulosic materials.

The ultra-dry solvents, which generally are available in standard volume commercial containers, are made in a process comprising passing the solvent through one or more drying columns. The solvent then is recirculated to the container, with re-circulation of the solvent through the container and column occurring for a period effective for reducing the moisture content to less than about 100 ppm to provide an ultra-dry solvent.

For purposes of the invention, "metal" or "metal agent" means organic aluminum, magnesium, zinc or blends thereof. As used herein, "metal alkoxide" means an organic aluminum alkoxide, magnesium alkoxide, zinc alkoxide or blends thereof. As used herein, "metal carbonate" means an organic aluminum carbonate, magnesium carbonate, zinc carbonate or blends thereof.

DESCRIPTION OF THE INVENTION

The present invention is directed to a composition and method for treating printed cellulosic materials to preserve the materials with little to no negative impact on inks, images, bindings or other features. The invention also is directed to methods of making the composition. More particularly, the invention is directed to compositions including organic aluminum, magnesium, and/or zinc agents and ultra-dry solvents. The metal agents are blended with ultra-dry alcohol solvents with carbon dioxide to produce a non-aqueous deacidification concentrate composition. This concentrate composition is blended with ultra-dry solvents to produce a deacidification composition that can be used in sprays and solutions to protect books and documents against aging.

Method of Making the Deacidification Composition

Figure 1:
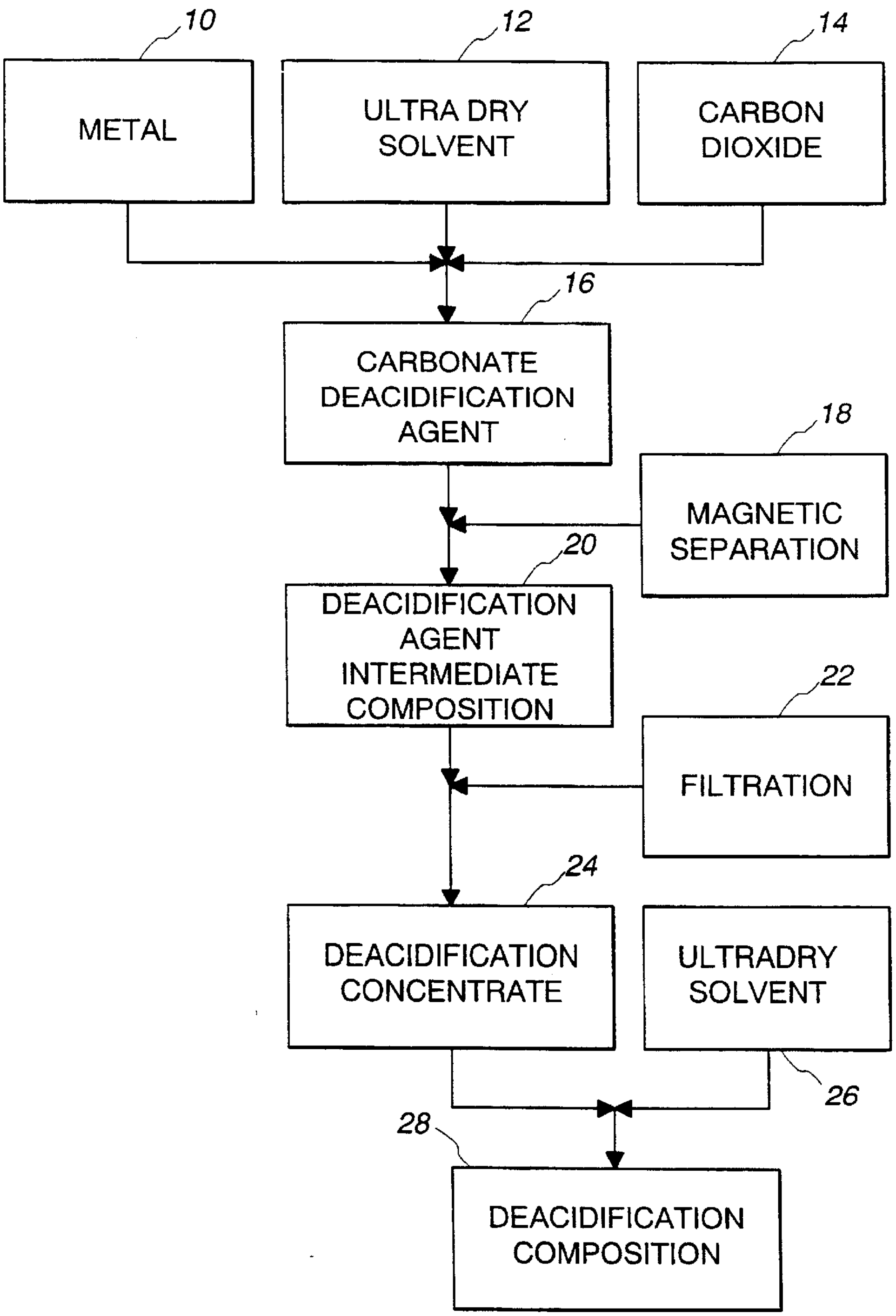
FIG. 1 is a flow diagram showing the method of making compositions for treatment of printed cellulosic materials.

Referring to FIG. 1, which shows a single phase method of manufacturing compositions of the present invention, metals 10 first are blended with an ultra-dry solvent 12 and carbon dioxide 14. In an important aspect, the metals used in the composition are organic aluminum, magnesium, zinc or combinations thereof. The metal may be in the form of metal chips or a metal alkoxide. Preferably, the solvent is an alcohol having 1 to 4 carbon atoms. The metal and solvent may be blended with stirring, shaking or other agitation as necessary to provide a blend composition.

The metal, ultra-dry solvent and carbon dioxide react to provide a deacidification agent 16 comprising metal carbonate. Magnets 18 are immersed or otherwise contacted with the deacidification agent for removal of sub-micron particle impurities to provide a deacidification agent intermediate composition 20.

The organic metal carbonate concentrates are refined and purified by removing iron and associated heavy metals (e.g. copper and cobalt) present in the black magnetic particles. The submicron particles are removed by attachment to magnets, agglomeration and filtration through membrane filters. Additionally, allowing the agglomerates to settle and decanting the concentrate may be used, as well as any combination of these procedures. Magnetic filtration may occur in single step (FIG. 1) or multiple step magnetic filtration (not shown).

The primary advantages of a single step procedure are speed of removal and minimization of the contamination from moisture. Additionally, the resulting concentrates are thinner and filter rapidly, subsequent blending, mixing, and transfer processes occur more readily, and costs of more processing and losses of concentrate composition during additional membrane filtration steps are avoided.

Single step magnetic filtration emphasizes attracting particles to the magnetic poles. Though higher concentrations are possible, typically 25.0, 37.5, 50.0, 62.5, or 75.0 percent concentrations in methanol are manufactured. Concentrations in ethanol and isopropanol are typically 25.0 to 37.5 percent by weight. Magnets are immersed in the completed concentrate to agglomerate, attract, and collect the particles.

Teflon coated rod (ALNICO V) magnets (½" by 6") designed for use as spin bars in magnetic mixers may be used. Other magnets, including electromagnets, magnetic grids, or magnetic particles which can readily be separated from the solutions being treated, and flow-through magnetic treatment chambers, may be substituted for the spin bar magnets. The magnets may be placed either in or outside of the concentrate solution being magnetically filtered.

Multiple step filtration involves repeating the complete single step cycle at two or more pre-selected concentrations. For example, the organic metal carbonate concentrate is initially manufactured to 37.5 percent by weight concentration, magnetically filtration treated, and membrane filtered through a 0.2 micron filter. Then 25 percent more organic metal carbonate is blended with the concentrate and the now 62.5 percent concentrate is again magnetically and membrane filtered. Finally, 12.5 percent more organic metal carbonate is blended in, magnetically and membrane filtered to produce a concentration level of 75.0 percent by weight in methanol.

The primary advantages of the multi-step procedure are that stronger concentrates exceeding 100 percent by weight can be produced, and the quantities of fine black particulates do not build up because they are removed as they are formed. In addition, the potential for alcohols from multi-step concentrates to deface books and documents by dissolving inks is essentially eliminated. The quantity of free alcohol is very low, typically below 1 percent, and preferably below 0.5 percent by weight in the paper treating solutions.

Subsequent to the magnetic treatment, the composition is filtered 22 using membrane filtration. Sub-micron pleated membrane (0.2 micron or smaller pore size) filtration occurs after the desired concentration is attained, typically at the 37.5 and 62.5 percent concentrations, and after the solution has been separated from the magnets bearing the black magnetic particles. The 25.0 percent by weight organic metal carbonate concentrations can be filtered through a 0.2-micron filter after overnight treatment, the 37.5 percent concentrate two days after manufacture.

The concentrates may be subjected to moderate warming during their manufacture. Additional amounts of ultra-dry solvents may be blended with the concentrates, as necessary for filtration. Filtration below the boiling point of the alcohol being used is essential. The heat reduces the viscosity of the concentrates, and improves magnetic filtration by reducing the required propelling pressure and increasing the rate of flow through membrane filters.

Membrane filters commercially available having pores larger than 0.2-microns do not completely remove the agglomerated particles and residual fines from concentrate solutions. Ultra fine membrane filters, e.g., 0.1, 0.05, and 0.01-micron actual pore size (finest currently commercially available is 0.01-microns) may be substituted for the 0.2 micron filters to produce more pure filtrates.

Filtration provides a deacidification concentrate 24. The deacidification concentrate then is blended with an ultra-dry solvent 26 to provide a deacidification composition 28. In an important aspect, the solvent is an alcohol with 1 to 4 carbon atoms, an aliphatic hydrocarbon with 1 to 8 carbon atoms, a fluorocarbon hydrocarbon, or mixtures thereof. The deacidification concentrate and solvent may be blended with stirring, shaking or other agitation as necessary to provide a blend composition.

In an alternate embodiment, organic aluminum alkoxides, with or without a carbon dioxide adduct and either alone or in combination with organic magnesium or zinc agents, are also useful deacidification agents. They may be soluble directly in aliphatic and fluorocarbon solvents without an alcohol co-solvent.

Ultra-Dry Solvents

The commercially available solvents that may be used in the present invention include alcohols having 1 to 4 carbon atoms and aliphatic and halogenated hydrocarbon solvents. Such solvents include methanol, ethanol, isopropanol, isobutanol, propane, butanes, pentanes, isohexanes, heptanes, difluoroethane (HFC-152a), and tetrafluoroethane (HFC-134a), HFC-32, HFE-7100, HFE-7200, and HFC-10-43MEE.

Moisture which may be present in solvents presents a major problem in preparing stable and non defacing organic metal carbonate deacidification compositions, sprays, and solutions. Moisture, even under 50 or 100 ppm, may react with organic metal carbonates to form soluble hydrates or gels that may thicken the solution or produce precipitates. In an important aspect of the invention, the moisture level of alcohol solvents is no more than about 100 ppm and in a very important aspect, no more than about 25–50 ppm. In an important aspect of the invention, the moisture level of fluorocarbon and aliphatic solvents is no more than about 100 ppm and in a very important aspect, no more than about 5–15 ppm.

In an important aspect, the composition of the invention comprises fluorocarbon solvents. Preferably, the fluorocarbon solvent is HFC-134a. Mass deacidification solutions containing HFC-134a solvent have almost no detrimental effect on all printing inks tested. Higher alkaline reserves are possible, if desired, because the metal carbonates, especially MMMC concentrates, have increased solubility in HFC-134a. It is possible to achieve increased concentrate solubility using fluorocarbon solvents in the composition of the present invention, as compared to chlorofluorocarbon solvents.

Previously soluble inks, such as purple mimeograph, photocopy, and fast printing, offset inks that HCFC solvents such as HCFC-22 destroyed, are unaffected by treatment with HFC-134a or HFC-152a, with the same and far higher levels of alcohol.

An almost total lack of ink solubility (when HFC-134a solvent is substituted) indicates that alcohols have not caused inks to feather, offset, or run, etc., as heretofore believed. (Rather the CFC and HCFC solvents most likely caused such results.) As a result, low unit-cost universal mass deacidification treatment is possible for preservation of archive and library general collections. The pre-selecting or exclusion of collections or individual books for suitability for deacidification, e.g., ink sensitivity, physical condition, or type of paper is no longer necessary.

Solvents in the mass deacidification composition of the present invention can be completely recovered and recycled indefinitely with minimal benefaction requirements beyond adjustment for additional alcohol introduced in the make-up concentrate.

Deacidification Composition

The blending of powdered metal ethoxides (or metals) with an ultra-dry alcohol (methanol, ethanol, isopropanol or isobutanol) with carbon dioxide occurs more rapidly. The concentrates of metal carbonates in methanol/ethanol are much thinner, easier to process and filter, and more pure following filtration.

Solids contents from about 25 to about 110 percent by weight of the organic metal carbonate in methanol may readily be produced, from about 25 to about 50 percent in ethanol, from about-zero to about 40 percent in isopropanol and from about 0 to about 30 percent is isobutanol.

These ultra-dry, stronger concentrates of organic metal carbonates form stable solutions in non-chlorinated fluorocarbon solvents such as difluoroethane (HFC-152a) and tetrafluoroethane (HFC-134a). When first blended, the concentrates may instantaneously precipitate out of solution on contact with HFC-134a and slowly, over one to three or more days, gradually with agitation (shaking and stirring) form a stable solution. The concentrates tend to go into solution in HFC-134a very rapidly when the HFC-134a is added in increments, e.g., 1:1, 1:4, 1:8, etc.; whereas direct blending at a 1:8 ratio produces a precipitate.

Varying the temperature of the final solution over a range from about −10 to about 130° F. and its concentration from less than about 1 to about 50 percent by weight had no affect on the stability of the solution in HFC-134a solvent.

A preferred deacidification composition for preserving paper includes from about 0.1 to about 4.0 percent of organic metal carbonate, from about 0.5 to about 10 percent by weight of ultra-dry alcohol and from about 86 to about 99 by weight aliphatic or fluorocarbon solvent, each based upon the weight of the total composition. In an important aspect, from about 0.5 to about 3.0 percent metal carbonate of the deacidification composition is thoroughly impregnated throughout the paper being protected against aging.

One deacidification composition comprises methoxy magnesium methyl carbonate (MMMC) deacidification agent (which may include ethoxy components) blended with HFC-134a at 0.5 to 4.0% by weight with a very low level, less than 1% by weight, of free methanol in the treatment composition. More methanol up to 10 percent may be used, if desired.

A second composition comprises from about 0.25 to about 5.0 percent by weight of isopropoxy magnesium isopropyl carbonate (PMPC) blended with HFC-134a solvent including from about 1.0% to about 10% isopropanol. The PMPC concentrate may include methyl and/or ethyl carbonate components.

Deacidification agents, MMMC and PMPC produce similar deacidification treatment results with HFC-134a. The MMMC is preferred because stronger concentrates may be prepared, the recovered solvents are easier to recycle, the treated books have a much lower odor level immediately after treatment and hazards are reduced because less flammable material is involved.

Solutions of PMPC concentrate in aliphatic hydrocarbon solvents, are extremely stable and combinations of solvents even dry to powder in open beakers in air without precipitation. Non-clogging aerosol sprays, solutions for brushing, and dipping paper may be prepared that do not produce white deposits during treatment.

Ultra-Drying Process

Ultra-drying in accordance with the present invention provides more stable deacidification products during shipment, storage, and use, as well as allows manufacture of products not possible until now. The compositions of the present invention are further blended with ultra-dried solvents to produce non-aqueous deacidification compositions for use as sprays and solutions for preserving books and documents. With ultra-drying of the solvents, the quality and purity of starting solvents are established to a standard condition and can be used to produce finished products with predictable and reproducible properties.

Figure 2:
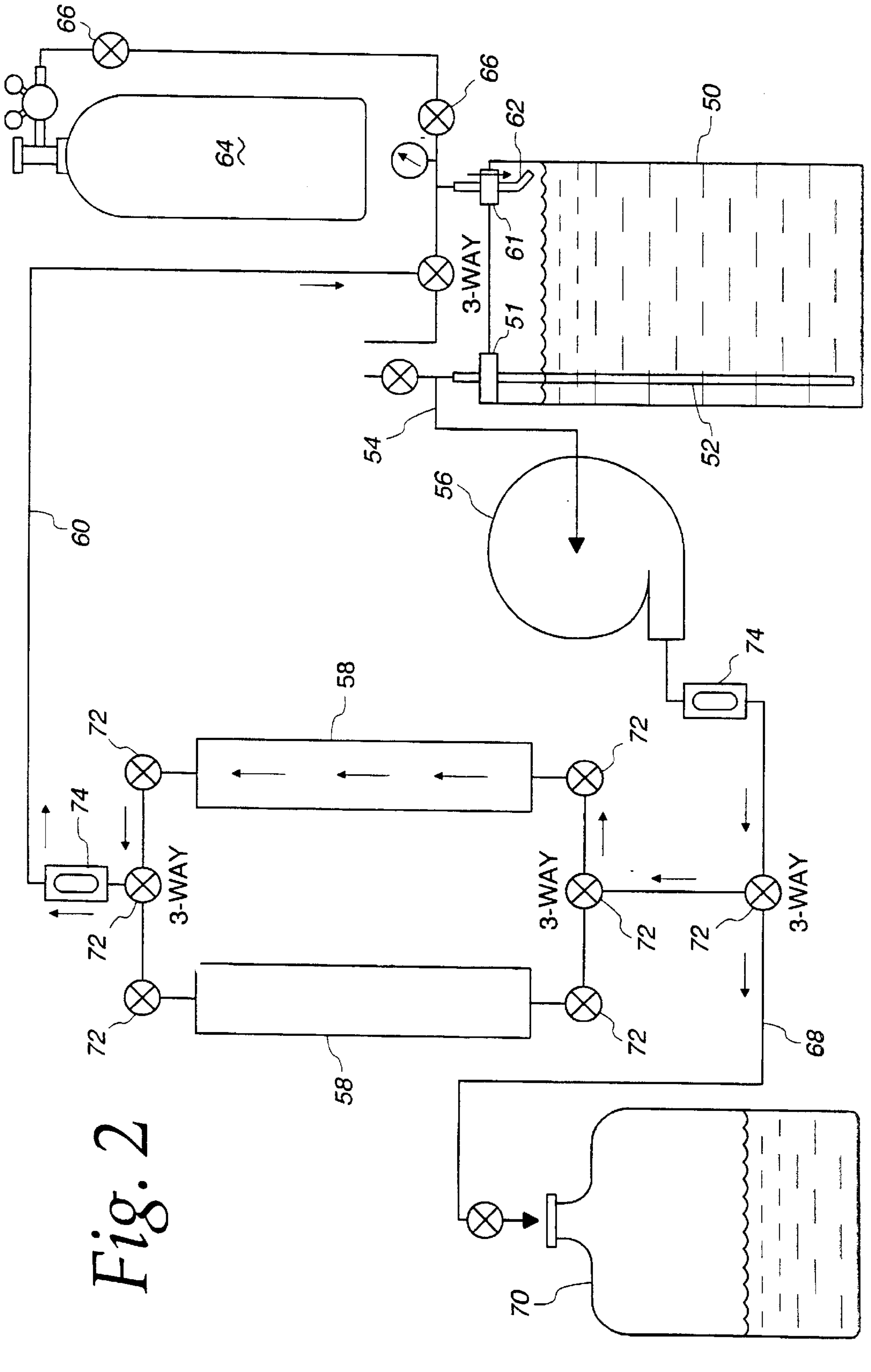
FIG. 2 is an illustration of an apparatus for drying deacidification solution solvents in accordance with the present invention.

Solvents, which are delivered in standard 55-gallon drums or similar containers, typically having moisture levels of at least about 1000 ppm, may be inexpensively transformed into ultra-dry solvents using the apparatus of the present invention, as shown in FIG. 2. The drums 50 have two threaded openings (one 2" I.D. opening 51 and one ¾" I.D. opening 61). A dip tube 52 or similar piping extends into the drum through the 2 in. I.D. opening 51, preferably down to at or near the bottom of the drum.

One or more pumps 56, such as electromagnetic or compressed air-driven pumps, draw the solvent from the drum 50 up through the dip tube 52 and through the inlet line 54 to one or more drying columns 58. The solvent is passed through the columns and returned back to the drum via a return line 60. The return line extends through the ¾" I.D. opening 61. Inside the drum, the returned solvent is discharged via a tube 62. Preferably, the tube 62 is angled or otherwise configured to promote splashing and circulation as the solvent is discharged in order to provide a mixing action.

The solvent is recirculated through the drum and column until the moisture content is reduced to the desired level to provide an ultra-dry solvent. The solvent may be removed via a removal line 68 and transferred into smaller containers, such as 6.5 gallon carboys, for subsequent use, if desired.

A source 64 of nitrogen gas, or equivalent, is connected to the headspace in the drum to provide an inert atmosphere and a pressure head for pumping. Valves 66 control the flow of gas into the drum.

Various valves 72 control the flow through the drum and columns. Sight valves 74 are provided along the lines, as necessary. The preferred materials for transfer hoses, connections, and valves are Teflon and stainless steel. For safety's sake, equipment and hoses must be grounded because the flowing solvents can produce static electric charges that, if not discharged, may cause electric sparks.

UOP Molecular Sieve M/S 3A is effective in drying methanol, ethanol, and isopropanol; HFC and aliphatic hydrocarbon solvents. UOP Molecular Sieve M/S 4A, XH-7, and XH-9 may be used to dry and also remove alcohol from HFC, and aliphatic hydrocarbon solvents. Equivalent desiccants from other manufacturers, e.g. MS-592 and MS-594 from Grace, also may be used.

Alternative drying products include highly desiccated silica gel and desiccant aluminum oxide and silicate powders. All of these desiccants may be used in alternate forms; e.g., molded core dryers prepared to fit into a specific steel shell. Fluorocarbon solvents, such as HFC-134a, may cause some of these desiccants, e.g., UOP M/S 3A, to evolve a fine, white powder that can be removed during filtration.

Figure 3:
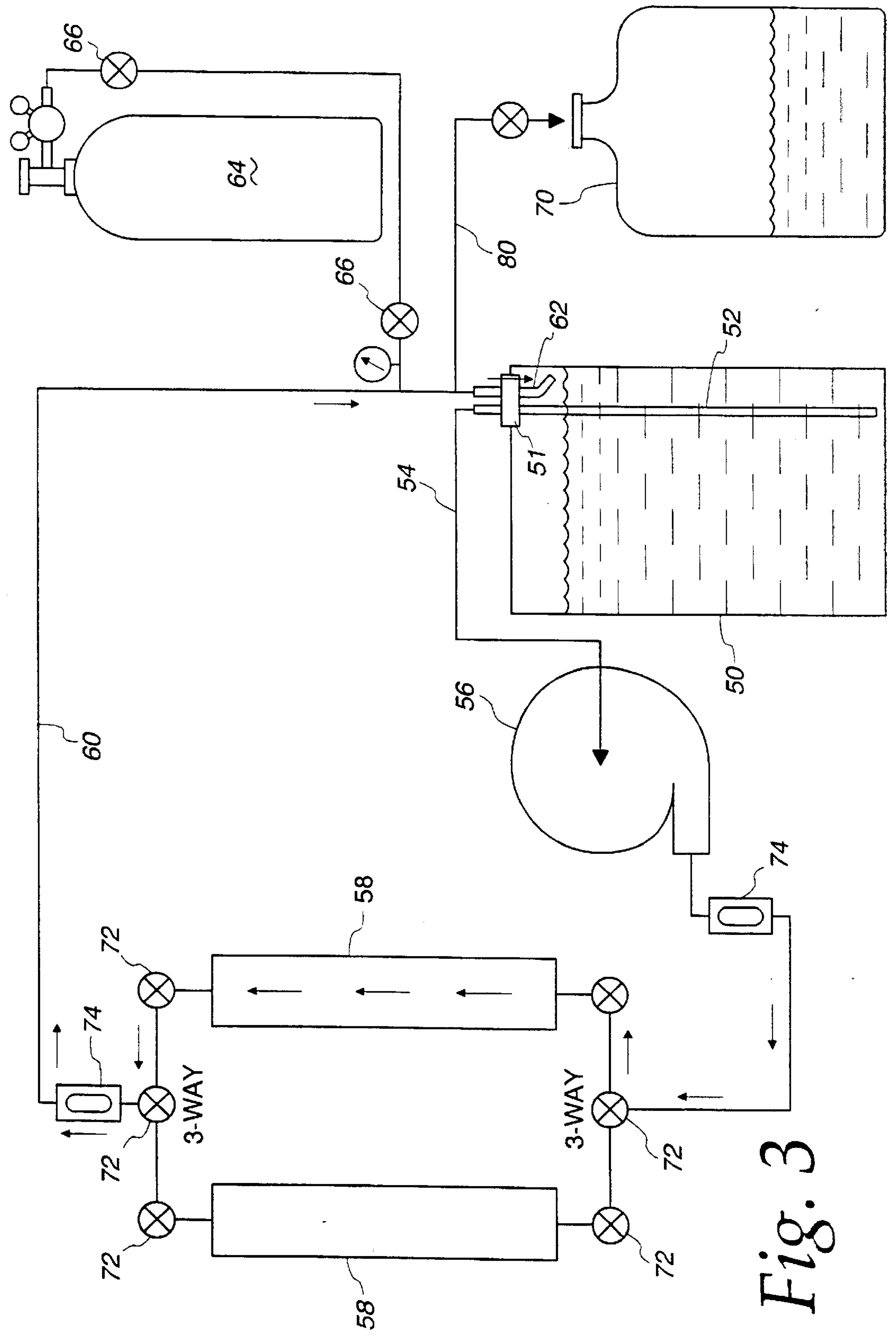
FIG. 3 is second embodiment of the apparatus of FIG. 2.

In a second embodiment, as shown in FIG. 3, both lines extend through the same opening of the drum. For ease of reading, features of the first embodiment will be given the same reference numerals in FIG. 3 as used above. The inlet line 54 and return line 60 both extend through the 2" I.D. opening 51.

The removal line 80 extends from the return line 60 above the drum. The remaining features are as shown and described above for FIG. 2.

Deacidification Treatment

The deacidification compositions of the present invention may be used in processes for treating and preserving printed cellulosic materials. The compositions can be used to prepare aerosols, solutions or other forms, as desired.

The deacidification compositions may be used with any known treatment process. Generally, a process for mass deacidification using the composition in a solution form includes first thoroughly drying under vacuum the materials to be treated. The materials then are contacted with the composition for a period of time effective for thoroughly wetting the materials. During contact, the composition may be impregnated under pressure into the materials. After the solution is removed from the materials, any solution remaining in the materials is vaporized for recovery and recycling to vacuum conditions. In this process, it is possible to recover at least about 93–95% of the deacidification solution, which can be re-used in the process.

The following examples illustrate compositions and methods for carrying out the invention. These examples should be understood to be illustrative of, but not limiting upon, the scope of the invention which is defined in the appended claims.

EXAMPLE 1

Ultra-Dry Methanol

Anhydrous methanol delivered in a 200 liter drum is treated using the apparatus of FIG. 1. The methanol initially contains 900 ppm water. The drying columns are 24" high columns filled with UOP molecular sieve desiccant M/S 3A., connected by ¼" I.D. Circulation through Column 1 and subsequently Column 2 is continued for 36 hours consecutively in each drying column. The final water content of the methanol after treatment is 25 ppm.

EXAMPLE 2

Ultra-Dry Isopropanol

A 55-gallon drum of isopropanol is ultra-dried as described in Example 1. The moisture content of the isopropanol is reduced from 800 ppm at beginning to 20 ppm at end.

EXAMPLE 3

Ultra-Dry Isopentane

Isopentane solvent is treated in a 55 gallon stainless steel drum with the apparatus of FIG. 3. The moisture content of the isopentanes solvent is reduced from 1,000 ppm at beginning to 15 ppm at end.

EXAMPLE 4

MMMC Concentrate & Single Step Magnetic Filtration

On Day 1, four kilograms of granulated magnesium ethoxide and carbon dioxide gas are added to two 6.5-gallon flint glass carboy containing 14 liters of ultra-dry methanol prepared in Example 1. The components are reacted to produce a coal black, organic magnesium carbonate solution of MMMC in methanol. The magnesium ethoxide is kept in suspension in the methanol using an electromagnetic mixer; the carbon dioxide gas is added at ambient pressure at a rate of 5 cfm/hr. through a gas diffusion stone.

On Day 2, two kilograms more magnesium ethoxide are reacted to produce a 37.5 percent concentrate. On completion of the reaction, four wired together, magnetic stirring rods (½" by 6" each), are immersed in one of the two concentrates to provide magnetic filtration. The carboy and contents of both concentrates are maintained at 100° F.

On Day 3, the four magnets are removed and the mother liquor, now a translucent gray color, is filtered using 15 psig nitrogen gas pressure through a 20" long, 0.2-micron membrane filter in fifteen minutes to produce a water clear, light straw colored concentrate solution of filtrate: The poles of the magnets were coated with a fine black powder 1/16" to ⅛" thick when removed from the concentrate.

On Day 3, the mother liquor without magnetic filtration in the second concentrate solution is still coal black. It has a hazy, blackish gray amber color after being filtered through a 0.2-micron filter. Most of the black particles remain so small they pass through the 0.2-micron pores.

EXAMPLE 5

PMPC Concentrate & Single Step Filtration

On Day 1, three kilograms of granulated magnesium ethoxide and carbon dioxide gas are added to two 6.5-gallon flint glass carboys containing 15 liters of ultra-dry isopropanol prepared in Example 2, and reacted as described in Example 4 to form isopropoxy magnesium isopropyl carbonate (PMPC). On completion of the reaction, magnets are inserted in one carboy to provide magnetic filtering, and the concentrates are maintained at 110° F. as described in Example 4.

On day 5, the magnets are removed and the mother liquor, now a blackish gray-brown color, is filtered in 25 minutes to a clear amber concentrate filtrate.

Without magnetic filtration, the mother liquor remains black and, after filtering through a 0.2-micron filter, is a blackish charcoal gray color.

Without magnetic filtration and concentrate heating, the PMPC concentrate needs weeks of natural aging for agglomeration before it can be filtered to a dark amber concentrate.

EXAMPLE 6

Methoxy Zinc Methyl Carbonate Concentrate

On Day 1, 1.5 kilograms of fine zinc chips with a catalyst is added to a magnetically stirred, 6.5-gallon flint glass carboy containing 14 liters of ultra-dry methanol prepared in Example 1, and reacted at 100° F. to form zinc methoxide. Carbon dioxide is added as described in Example 4 to form methoxy zinc methyl carbonate (MZMC). On completion of the reactions, magnets are inserted to provide magnetic filtering, and the concentrates are maintained at 100° F. as described in Example 4.

On Day 2, the magnets are removed and the mother liquor, now a translucent gray color, is filtered using 10 psig pressure through a 0.2 micron membrane filter in fifteen minutes to produce a water clear, near white concentrate filtrate.

EXAMPLE 7

Isopropoxy Zinc Isopropyl Carbonate Concentrate

On Day 1, one kilogram of fine zinc chips with a catalyst is added to a magnetically stirred, 6.5-gallon flint glass carboy containing 15 liters of ultra-dry Isopropanol prepared in Example 2, and reacted at 110° F. to form zinc isopropoxide. Carbon dioxide is added as described in Example 4 to form isopropoxy zinc isopropyl carbonate (PZPC). On completion of the reactions, magnets are inserted to provide magnetic filtering, and the concentrates are maintained at 110° F. as described in Example 4.

On Day 2, the magnets are removed and the mother liquor, now a translucent gray color, is filtered using 10 psig pressure through a 0.2 micron membrane filter in fifteen minutes to produce a water clear, near white concentrate filtrate.

EXAMPLE 8

Magnetic Multi-Step Filtration

On Days 1, 2, and 3, a 37.5 percent concentrate of MMMC is prepared and magnetically filtered as described in Example 5. Also on Day 3, four kilograms more granulated magnesium ethoxide and carbon dioxide gas are reacted with the filtrate to produce a 62.5 percent, coal black MMMC concentrate. Again four magnets are inserted to provide magnetic filtration, and the concentrate is maintained at 110° F.

On Day 5, the four magnets are removed, cleaned, dried, and replaced. Their poles are coated with a fine black powder 1/16" to ⅛" thick when removed from the concentrate. The four cleaned magnets are re-inserted on Day 5, and contents kept at 110° F. On Day 7, the magnets (coated 1/16" to ⅛" thick) are again removed; and the 62.5 percent concentrate is filtered for the first time with a 20 psig. Nitrogen gas pressure through a 0.2-micron filter in 45 minutes. The concentrate filtrate is a light amber color that dries to a snow white powder.

EXAMPLE 9

Mass Deacidification—PMPC

Forty-five pounds PMPC concentrate from Example 5 are added, under nitrogen gas, to a 16-gallon stainless steel tank, thinned with 45 pounds of HFC-134a, and mixed for 30 minutes on a seesaw shaker to produce a 1:1 PMPC/HFC-134a ratio. The tank is pressurized to 160 psig with nitrogen gas in preparation for manufacture of a liquefied gas mass deacidification solution.

Seventy pounds HFC-134, nine pounds of 50/50 PMPC HFC-134a concentrate, and 40.5 pounds HFC-134a are transferred into a vacuum dried 12.5 gallon steel shipping cylinder, which is inverted and mixed for 30 minutes on a seesaw shaker.

Books and documents representing successfully treated and damaged or destroyed materials in CFC and HCFC solvent mass deacidification solutions are selected for treatment in the Wei T'o Liquified Gas Mass Deacidification System.

The PMPC solution, initially hazy from fine bubbles, clears to give a crystal clear, water white solution in the sight glasses with no signs of discoloration, precipitation, or phase separation before and after use, as compared to HCFC-22 solution and previous CFC containing solutions which show a slight yellowing after use.

All materials treated with the PMPC/HFC-134a solution show fewer signs of treatment change than occurs in books treated with the HCFC-22 formulation. Books regularly treated in HCFC-22 have equal or superior appearance after treatment with the PMPC/HFC-134a solution. Most books, inks, and other components normally identified as untreatable in CFCs and HCFCs exhibit no, or very few, changes from treatment. These materials included fast printing inks used for ephemeral government reports and pamphlets, and purple mimeograph inks. No covers or illustrations (including heavily black inked ones) show unsightly bloom or white iridescent deposits.

As compared to treatment with HCFC-22 solutions, the books and bindings were straighter and text blocks less distorted and expanded. All of the protective plastic films on paperback book covers were less affected. The binding adhesives in almost perfect bound and paperback books were unaffected. No bindings loosened or came completely apart.

| Sample | pH Control[1] | pH Treated[1] | Alkaline Reserve treated[2] |
|---|---|---|---|
| Book A[3] | 3.78 ± 0.00 | 9.04 ± 0.02 | 0.65 ± 0.03 |
| Book B[4] | 5.23 ± 0.03 | 9.05 ± 0.01 | 0.71 ± 0.02 |
| Book C, Paper #5[5] | 6.24 ± 0.05 | 8.71 ± 0.02 | 0.96 ± 0.04 |
| Book C, Paper #6[6] | 5.23 ± 0.02 | 9.69 ± 0.00 | 0.91 ± 0.01 |

[1]CPPA Standard G.25P
[2]ASTM Standard D 3290, 11.4 (modified by using pH meter to determine end point)
[3]Department of Mines and Technical Surveys
[4]Performance Measurement in Federal Libraries
[5]Test Book (National Library of Canada), Paper #5, "Alum Rosin"
[6]Test Book (National Library of Canada), Paper #6, "New Newsprint"

EXAMPLE 10

Mass Deacidification—MMMC

MMMC concentrate (28.5-pounds) from Example 4 is diluted with 57-pounds of HFC-134a in a 16-gallon tank and mixed for 15 minutes on a seesaw shaker. Fifty-seven more pounds of HFC-134a are added, and mixed again for 15 minutes to form a 1:5 ratio solution.

The actual mass deacidification solution is prepared in clean, vacuum dried 12.5-gallon steel cylinders in four weighing and two mixing steps:

(1) 26 lbs of HFC-134a Recovered Solvent; (2) 23.75 lbs. MMMC at 1:5 Ratio;

(3) 25 lbs. HFC-134a Recovered Solvent; (3a) Mix on Seesaw Shaker for 10 minutes; (4) 50.25 lbs. HFC-134a Recovered Solvent; (4a) Mix on Seesaw Shaker for 15 minutes.

The results equal or exceed the quality of treatments from all previous treatments including the PMPC/HFC-134a treatment of Example 9. Overall, the MMMC/HFC-134a solution treatment is preferred because it has less residual odor, is easier to manufacture and filter, is more readily recovered and recycled, and its stronger concentrates produce higher alkaline reserves.

EXAMPLE 11

Zinc Mass Deacidification—MZMC

MZMC concentrate (28.5-pounds) from Example 6 is diluted with 57-pounds of HFC-134a in a 16-gallon tank and mixed for 15 minutes on a seesaw shaker. Fifty-seven more pounds of HFC-134a are added, and mixed again for 15 minutes to form a 1:5 ratio solution. The actual mass deacidification solution is prepared in clean, vacuum dried 12.5-gallon steel cylinders in four weighing and two mixing steps: (1) 26 lbs. HFC-134a Recovered Solvent; (2) 23.75 lbs. MZMC 1:5 Ratio; (3) 25 lbs. HFC-134a Recovered Solvent; (3a) Mix on Seesaw Shaker for 10 minutes; (4) 50.25 lbs. HFC-134a Recovered Solvent; (4a) Mix on Seesaw Shaker for 15 minutes.

As the pH of deacidified paper after deacidification remains near 7.5, sensitive yellow, blue, green, and red colorants used in works of art do not change color.

EXAMPLE 12

Soft Spray—PMPC

Four pounds of the 1:1 ratio PMPC/HFC-134a concentrate prepared in Example 9 are transferred into a clean, vacuum dried 4.5-gallon steel cylinder and used in situ to prepare a new formulation of Wei T'o Soft Spray (U.S. Pat. No. 4,860,685, incorporated in its entirety herein by reference). Four weighing addition steps are involved: (1) 20.0 lbs. Ultra-dry HCFC-141b. (Example 4); (2) 4.0 lbs. PMPC/HFC-134a (1:1 ratio) (Example 7); (3) 15.0 lbs. Ultra-dry HCFC-141b (Example 4); (4) 2.0 lbs. HFC-134a; (4a) Nitrogen gas at 80 psig.; (4b) Mixing on Seesaw Shaker for 10 min.

EXAMPLE 13

Soft Spray—Heptane & Propane

A 4.5-gallon cylinder of Soft Spray is prepared as is described in Example 11 except flammable solvents are substituted for HCFC-141B and HFC-134a: (1) 1.00 lbs. Ultra-Dry Isopropanol (Example 3); (2) 10.00 lbs. Ultra-dry Low aromatic heptanes (Example 4); (3) 2.125 lbs. PMPC Concentrate (Example 7); (4) 10.00 lbs. Ultra-dry Low aromatic heptanes (Example 4); (5) 3.00 lbs. Propane; (5a) Nitrogen gas at 80 psig.; (5b) Mixing on Seesaw Shaker for 10 min.

EXAMPLE 14

Soft Spray—Pentane & HFC-152a

A 4.5-gallon cylinder of Soft Spray is prepared as is described in Example 12 except flammable solvents Pentane and HFC-152a are substituted for HCFC-141B and HFC-134a respectively. The weighing and preparation sequence is: (1) 1.00 lb. Ultra-Dry Isopropanol (Example 3); (2) 8.50 lbs. Ultra-dry Isopentanes (Example 4); (3) 2.125. lbs. PMPC Concentrate (Example 7); (4) 8.50 lbs. Ultra-dry Isopentanes (Example 4); (5) 3.00 lbs. HFC-152a; (5a) Nitrogen gas at 80 psig.; (5b) Mixing on Seesaw Shaker for 10 min.

EXAMPLE 15

Aerosol—3M HFE-7100 (methoxy-nonafluorobutane) & HFC-134a

A number of aerosol spray cans are filled with a non-flammable aerosol spray as follows. A non-pressurized formulation of solvents and concentrate is loaded into a stainless steel tank under nitrogen gas in the following order:

| | | |
|---|---|---|
| (1) Ultra-dry 3M HFE-7100 | 40.0 lbs. | (Example 4) |
| (2) PMPC Concentrate | 8.0 lbs. | (Example 7) |
| (3) Ultra-dry 3M HFE-7100 | 40.0 lbs. | (Example 4) |

The tank is closed and mixed, upside down, on a seesaw shaker for one hours, left stand over night and mixed again for one hour. The formulation is pressurized with ten psig of nitrogen gas, and is loaded 650 grams per unit into welded steel, epoxy-phenolic lined pint aerosol cans which are crimped closed with an all-steel, except neoprene gaskets, aerosol male tilt valve. The cans are pressurized with 125 grams of HFC-134a pressurized to 110 psig with nitrogen gas through the valve using a pressure burette, and subsequently mixed by vigorous manual shaking.

EXAMPLE 16

Aerosol—MMM HFE-7100 & HFC-152a

A number of aerosol spray cans are filled with a non flammable aerosol spray as in Example 15 except the HFC-134a propellant is replaced with HFC-152a on a molecular weight basis. The cans are pressurized with 100 grams of HC-152a as in Example 15.

EXAMPLE 17

Aerosol—Aliphatic Solvents & Propane

A number of aerosol spray cans are filled with a flammable aerosol spray. The following non-pressurized formulation of solvents and concentrate is weighed (directly from their ultra-drying drums or filtrate container) into a 16-gallon stainless steel mixing tank under nitrogen gas in the following order:

| | | |
|---|---|---|
| (1) Ultra-dry Low aromatic heptanes | 20 lbs. | (Example 4) |
| (2) Ultra-dry Isopentanes | 20 lbs. | (Example 4) |
| (3) PMPC concentrate | 9 lbs. | (Example 3) |
| (4) Ultra-Dry Isohexanes | 60 lbs. | (Example 4) |

The tank is closed and mixed upside down on a seesaw shaker for two hours, and then pressurized with 10-psig nitrogen gas. Welded, tin-free steel, aerosol cans, lined with an epoxy-phenolic coating, are filled 350 gms/can, and crimped shut with an all-steel, except neoprene gaskets, tilt-type, male, aerosol valve. The cans are pressurized through the valve with 65 grams of propane using a pressure burette transferred with 120-psig nitrogen gas pressure and mixed manually by vigorous hand shaking.

EXAMPLE 18

Aerosol—Pentane & HFC-152a

A number of aerosol spray cans are filled with a flammable aerosol spray as described in Example 17 according to the following formula:

| | | |
|---|---|---|
| (1) Ultra-dry Isopentanes | 40 lbs. | (Example 4) |
| (2) PMPC concentrate | 9 lbs. | (Example 3) |
| (3) Ultra-Dry Isopentanes | 40 lbs. | (Example 4) |

After mixing, the tank is pressurized with 10-psig nitrogen gas, and the aerosol cans are filled 300 gms/can, and crimped shut with a metal/plastic, female aerosol valve. The cans are pressurized through the valve with 75 grams of HFC-152a using a pressure burette pressurized with 100-psig nitrogen gas.

EXAMPLE 19

Zinc Aerosol—Pentane & HFC-152a

A number of aerosol spray cans are filled with a flammable aerosol spray as described in Example 17 according to the following formula:

| | | |
|---|---|---|
| (1) Ultra-dry Isopentanes | 40 lbs. | (Example 4) |
| (2) PZPC concentrate | 9 lbs. | (Example 3) |
| (3) Ultra-Dry Isopentanes | 40 lbs. | (Example 4) |

After mixing, the tank is pressurized with 10-psig nitrogen gas, and the aerosol cans are filled 300 gms/can, and crimped shut with a metal/plastic, female aerosol valve. The cans are pressurized through the valve with 75 grams of HFC-152a using a pressure burette pressurized with 100-psig nitrogen gas.

As the pH of deacidified paper remains near 7.0 sensitive yellow, blue, green, and red colorants used in works of art do not change color.

EXAMPLE 20

Aerosol—Barrier & Desiccant Protection

Aerosol spray cans prepared according to the above examples may malfunction and clog as a consequence of inadvertent moisture contamination following manufacture and delivery. This malfunction can be avoided by preventing the moisture in air from contacting the valves as follows using a moisture barrier film (e.g., polyvinylidene chloride film (Dow Chemical Saran Wrap 8)) and desiccant (e.g., United Technologies silica gel or UOP M/S 3A).

(1) Cover valve opening with 0.46 mil barrier film and press into place.

(2) Place a 3-gram bag of desiccant on top of film to fit under cap.

(3) Cover desiccant bag with 0.46 barrier film that extends over side of aerosol can and press into place. Additional or thicker films may be used.

(4) Snap tight fitting plastic in place sealing barrier film to can.

(5) Remove the excess barrier film extending from can.

(6) Replace the film and refresh (re-dry) the desiccant after partial usage to extend protective storage.

EXAMPLE 21

Solution—Pentanes & Heptanes

A number of glass quart bottles are filled with a flammable deacidification solution as follows. A non-pressurized formulation of solvent and concentrate is loaded into a stainless steel tank under nitrogen gas in the following order:

| | | |
|---|---|---|
| (1) Ultra-dry Low aromatic heptanes | 40.0 lbs. | (Example 4) |
| (2) PMPC concentrate | 9.0 lbs. | (Example 3) |
| (3) Ultra-dry Isopentanes | 40.0 lbs. | (Example 4) |

The tank is closed and mixed, upside down, on a seesaw shaker for two hours. The formulation is pressurized with ten psig of nitrogen gas, and transferred using Teflon tubing, 850 grams per unit, into glass quart bottles.

The bottles are closed with a conventional plastic threaded cap whose liner (gasket) is composed of paperboard covered with a sealing composite composed of aluminum foil covered with a Mylar (polyester terephthalate) plastic film or equivalent barrier material to prevent the inward migration of moisture from ambient air. The bottles are shaken subsequently vigorously manually to insure mixing. The resulting solution may be applied by dipping, brushing, spraying or other technique to thoroughly wet paper objects.

This solution can also be prepared in steel cylinders for spray application with nitrogen gas pressure, steel, phenolic-epoxy lined, or stainless steel cans, and other sizes of glass bottles, etc. with appropriate barrier closures as desired. Up to 10 percent, typically 3 to 5 percent, by weight of co-solvents bromopropane and/or diethylene chloride may be added to improve solubility of PMPC concentrate if desired.

The proportions of the aliphatic solvents may be varied to customize the rate of drying from and treatment penetration into paper, and indirectly control the evolution of solvent vapors into workroom air.

EXAMPLE 22

The composition of the two papers tested is as follows:

Paper A: an acid fine paper made of 50% hardwood bleached kraft, 50% softwood bleached kraft (post-industrial), 4% filler (clay), alum-rosin sizing and starch Paper B: an acid newsprint made of 100% thermomechanical pulp (TMP) with alum-rosin sizing The samples were conditioned at 23° C. and 50% RH prior to testing according to CPPA standard A.4.

TABLE 1

Testing Data

| Sample | Aging Time (Days)[1] | Number of double folds (at 500 g)[2] | Cold Extraction[3] (pH) | Alkaline reserve[4] (%) |
|---|---|---|---|---|
| A1 | 0 | 1186 ± 98 | 5.24 ± 0.04 | — |
| | 50 | 39 ± 6 | 4.74 ± 0.01 | — |
| A2 | 0 | 1499 ± 171 | 9.47 ± 0.10 | 1.65 ± 0.58 |
| | 50 | 1199 ± 110 | 10.19 ± 0.10 | 1.79 ± 0.17 |
| A3 | 0 | 1294 ± 133 | 9.68 ± 0.03 | 1.94 ± 0.04 |
| | 50 | 849 ± 129 | 10.12 ± 0.04 | 1.74 ± 0.14 |
| A4 | 0 | 1467 ± 159 | 10.28 ± 0.02 | 5.75 ± 0.23 |
| | 50 | 956 ± 127 | 10.57 ± 0.02 | 5.38 ± 0.18 |
| A5 | 0 | 1320 ± 164 | 9.80 ± 0.06 | 1.98 ± 0.16 |
| | 50 | 853 ± 87 | 10.13 ± 0.06 | 1.64 ± 0.12 |
| A6 | 0 | 1467 ± 151 | 9.67 ± 0.08 | 2.12 ± 0.17 |
| | 50 | 865 ± 122 | 10.34 ± 0.10 | 2.15 ± 0.21 |
| A7 | 0 | 1131 ± 121 | 9.74 ± 0.20 | 2.69 ± 0.22 |
| | 50 | 813 ± 98 | 10.42 ± 0.07 | 2.55 ± 0.30 |
| A8 | 0 | 1121 ± 152 | 9.78 ± 0.01 | 2.33 ± 0.11 |
| | 50 | 612 ± 72 | 10.20 ± 0.07 | 1.95 ± 0.43 |
| B1 | 0 | 1020 ± 108 | 5.51 ± 0.08 | — |
| | 50 | 115 ± 12 | 4.82 ± 0.08 | — |
| B2 | 0 | 929 ± 87 | 10.03 ± 0.11 | 1.71 ± 0.46 |
| | 50 | 690 ± 70 | 9.30 ± 0.92 | 0.44 ± 0.30 |
| B3 | 0 | 1065 ± 91 | 10.29 ± 0.04 | 2.98 ± 0.39 |
| | 50 | 690 ± 77 | 10.41 ± 0.09 | 1.79 ± 0.49 |
| B4 | 0 | 1059 ± 125 | 10.51 ± 0.04 | 5.05 ± 0.57 |
| | 50 | 422 ± 60 | 10.67 ± 0.07 | 5.98 ± 0.40 |
| B5 | 0 | 819 ± 141 | 10.29 ± 0.09 | 2.59 ± 0.10 |
| | 50 | 713 ± 128 | 10.41 ± 0.08 | 2.11 ± 0.26 |
| B6 | 0 | 1037 ± 139 | 10.31 ± 0.13 | 3.53 ± 0.32 |
| | 50 | 692 ± 109 | 10.49 ± 0.10 | 2.38 ± 0.47 |
| B7 | 0 | 1111 ± 143 | 10.38 ± 0.10 | 4.18 ± 1.70 |
| | 50 | 627 ± 71 | 10.54 ± 0.01 | 3.10 ± 0.15 |
| B8 | 0 | 932 ± 101 | 10.32 ± 0.02 | 3.27 ± 0.17 |
| | 50 | 501 ± 64 | 10.50 ± 0.07 | 2.52 ± 0.40 |

A1, B1 - Control
A2, B2 - Mass Deacidification - MMMC
A3, B3 - Aerosol - 3M HFE-7100 and PMPC/HFC-152a
A4, B4 - Aerosol - Isopentanes and PMPC/HFC-152a
A5, B5 - Aerosol - Low aromatic heptanes and PMP/HFC-152a
A6, B6 - Solution - 3M HFE-7100 and PMPC
A7, B7 - Solution - Isopentanes and PMPC
A8, B8 - Solution - Low aromatic heptanes and PMPC

[1]Paper and board - accelerated aging. Part 3: Moist heat treatment at 80° C. and 65% relative humidity. ISO Standard 5630/3. 1986

[2]Folding endurance and paper (MIT tester). Official Test Method T 511 om-88. Technical Association of the Pulp and Paper Industry Test Methods. 1992–1993.

[3]Hydrogen ion concentration (pH) of paper extracts (cold extraction method). Official Test Method T 509 om-88. Technical Association of the Pulp and Paper Industry Test Methods. 1992–1993.

[4]Standard test method for the determination of calcium carbonate content of paper. ASTM Standard D4988–89. Annual Book of ASTM Standards 15.09 (1990).

What is claimed is:

1. A composition for deacidifying a printed cellulosic material comprising in solution:

0.1–4 wt. % of at least one of an organic magnesium carbonate, an organic aluminum carbonate and an organic zinc carbonate;

0–10 wt. % of a $C_1$–$C_4$ alcohol having a moisture content of less than 100 ppm; and 86–99 wt. % of a solvent having a moisture content of less than 100 ppm comprising an aliphatic hydrocarbon and/or a hydrofluorocarbon.

2. A composition according to claim 1, comprising 0.5–10 wt. % of the $C_1$–$C_4$ alcohol.

3. A composition according to claim 2, wherein the alcohol has a moisture content of less than 50 ppm.

4. A composition according to claim 3 wherein the alcohol has a moisture content of less than 25 ppm.

5. A composition according to claim 1, where in the solvent has a moisture content of 5–15 ppm.

6. A composition according to claim 1, wherein the hydrofluorocarbon is HFC-134a (tetrafluoroethane).

7. A composition according to claim 1, wherein the solvent is a $C_1$–$C_8$ aliphatic hydrocarbon.

8. A method for preserving an acidic printed cellulosic material comprising the steps of thoroughly drying the printed cellulosic material under vacuum;

contacting the material with a deacidification composition as defined in any claims 1 to 7; and removing the deacidified printed cellulosic material from the composition.

9. A method for making a composition for deacidifying printed cellulosic materials comprising:

treating a $C_1$–$C_4$ alcohol with a molecular sieve or other desiccant to reduce the moisture content thereof below 100 ppm to produce an ultra-low moisture alcohol;

adding carbon dioxide and a metal in the form of metal chips or a metal alkoxide, the metal being selected from aluminum, magnesium or zinc, to the ultra-low moisture alcohol to form an organic metal carbonate composition and submicrometer-sized, magnetically susceptible impurities;

magnetically removing the submicrometer-sized magnetic impurities from the composition;

filtering the resulting organic metal carbonate composition through a submicrometer filter to produce a deacidification treatment concentrate; and blending the deacidification treatment concentrate with additional solvent having a moisture content of less than 100 ppm comprising an aliphatic hydrocarbon and /or a hydrofluorocarbon to prepare the deacidifying composition.

10. A method according to claim 9, wherein the ultra-low moisture alcohol has a moisture content of less than 50 ppm.

11. A method according to claim 9 or 10, wherein the hydrofluorocarbon is HFC-134a (tetrafluoroethane).

* * * * *